(12) United States Patent
Dolgin et al.

(10) Patent No.: US 12,044,793 B2
(45) Date of Patent: Jul. 23, 2024

(54) CROSS-TALK COMPENSATION FOR GRADIOMETER PROBES

(71) Applicant: Raytheon Company, Waltham, MA (US)

(72) Inventors: Benjamin Dolgin, Sterling, VA (US); Joseph J. Fraundorfer, Sterling, VA (US); Thomas G. Lavedas, Dulles, VA (US)

(73) Assignee: Raytheon Company, Tewksbury, MA (US)

( * ) Notice: Subject to any disclaimer, the term of this patent is extended or adjusted under 35 U.S.C. 154(b) by 479 days.

(21) Appl. No.: 17/369,280

(22) Filed: Jul. 7, 2021

(65) Prior Publication Data

US 2022/0011401 A1    Jan. 13, 2022

Related U.S. Application Data

(60) Provisional application No. 63/048,878, filed on Jul. 7, 2020.

(51) Int. Cl.
*G01S 7/02*    (2006.01)
*G01S 13/88*   (2006.01)
(Continued)

(52) U.S. Cl.
CPC .......... *G01S 7/0236* (2021.05); *G01S 13/887* (2013.01); *H01Q 1/36* (2013.01); *H01Q 1/525* (2013.01); *H01Q 7/00* (2013.01)

(58) Field of Classification Search
CPC ........ G01S 7/0236; G01S 13/887; G01S 7/02; G01S 7/021; G01S 7/36; G01S 13/88; H01Q 1/36; H01Q 1/525; H01Q 7/00; H01Q 1/08; H01Q 1/14; H01Q 1/52; H01Q 17/00; H04B 5/0081; H04B 5/0025; H04B 5/00; G01R 33/3657; G01R 33/441;
(Continued)

(56) References Cited

U.S. PATENT DOCUMENTS 7,714,791 B2    5/2010  Lavedas
8,717,242 B2    5/2014  Lavedas et al.
(Continued)

OTHER PUBLICATIONS

International Search Report and Written Opinion mailed Oct. 14, 2021 in corresponding International Application No. PCT/US2021/040805.
(Continued)

*Primary Examiner* — Ladimir Magloire
*Assistant Examiner* — Remash R Guyah

(57) ABSTRACT

A system/device, such as a gradiometer probe for detecting RF signals, or for example for explosive detection, has the shape of the coils in its adjustment mechanism that minimizes the cross-talk between the receiver probe (Rx) and the transmitting antenna (Tx) in such a way as to minimize (or reduce) the areas where the distance between the coils during the adjustment is the smallest. Moving coils along the plain of the coils is one mechanism of achieving it. Having the coils of different shapes, e.g., circular receiver and oval transmitter coils, is another. Many shapes are possible, including circular, oval, elliptical, and polygonal, to give a few examples. In some embodiments both of these methods/approaches are combined in a single device.

20 Claims, 3 Drawing Sheets

(51) Int. Cl.
*H01Q 1/36* (2006.01)
*H01Q 1/52* (2006.01)
*H01Q 7/00* (2006.01)

(58) Field of Classification Search
CPC .............. G01R 33/34007; G01R 33/44; G01N 24/084; G01V 3/00; G01V 5/0069; G01V 5/00
USPC .................................................... 342/22, 329
See application file for complete search history.

(56) References Cited

U.S. PATENT DOCUMENTS

| | | | |
|---|---|---|---|
| 8,816,824 | B2 | 8/2014 | Barry et al. |
| 9,129,200 | B2 | 9/2015 | Lavedas |
| 9,484,632 | B2 | 11/2016 | Lavedas |
| 9,575,147 | B2 | 2/2017 | Robert et al. |
| 9,812,790 | B2 | 11/2017 | Lavedas |
| 10,461,582 | B2 | 10/2019 | White, II |
| 2012/0049850 | A1* | 3/2012 | Reime .................... G01V 3/107 324/329 |
| 2015/0009088 | A1* | 1/2015 | Lavedas ................. H01Q 21/28 343/867 |
| 2018/0145404 | A1* | 5/2018 | Lavedas ................. H01Q 1/525 |

OTHER PUBLICATIONS

Ambrus Davorin et al, "A Portable Planar Coil Array for Frequency-Domain Inductive Sensing of Metallic Objects," 2020 IEEE International Instrumentation and Measurement Technology Conference (I2MTC), IEEE, May 25, 2020 (May 25, 2020), pp. 1-5.

Adel Zitouni et al: "Smart Electromagnetic Sensor for Buried Conductive Targets Identification,", IEEE Sensors Journal, IEEE Service Center, New York, NY, US, vol. 6, No. 6, Dec. 1, 2006 (Dec. 1, 2006), pp. 1580-1591.

Scott WR: "Broadband Array of Electromagnetic Induction Sensors for Detecting Buried Landmines", Proceedings/2008 IEEE International Geoscience & Remote Sensing Symposium: Jul. 6-11, 2008, John B. Hynes Veterans Memorial Convention Center, Boston, Massachusetts, U.S.A, IEEE, Piscataway, NJ, Jul. 7, 2008 (Jul. 7, 2008), pp. II-375.

* cited by examiner

CROSS-TALK COMPENSATION FOR GRADIOMETER PROBES

RELATED APPLICATION

This application claims priority from U.S. Provisional Application 63/048,878, filed Jul. 7, 2020, which is incorporated by reference in its entirety.

FIELD

The present disclosure relates generally to RF circuits, probe structures, antenna systems, and related techniques and methods to improve undesirable far-field suppression and intra-probe isolation in part or all of these devices, as well as systems, methods, and devices for improving near-field sensing applications, like RFID and explosive detection systems.

BACKGROUND

At least some known radio-frequency identification (RFID) and some explosive detection systems use loop-type radiators for interrogator antennas, for example, an antenna consisting of a figure-eight shaped conductor to effect a reduction in the creation or reception of energy in their far-field regions. That is, loop antenna systems can be designed such that the coupling between the antenna and its nearby surroundings is relatively high, whereas the coupling between the antenna and its distant surroundings is minimized. By using two or more loops in combination, where the loops have a specific size and geometry, the magnitude of the current within the loops and the direction of the currents generated fields work to cancel each other out in the far-field region (that is, the sum of the fields created from each of the antenna loops is close to zero.) Antennas that cancel signals in the far-field region may be referred to as "gradiometer antennas," "near field probes," or "differential antennas." All of these terms are used herein interchangeably, with similar meaning intended.

One application for near field probes (including those using loop-type radiators) is in a detection system used to exploit a material's Nuclear Quadrupole Resonance (NQR), where NQR is a radio frequency (RF) magnetic spectroscopic technique that has been used to create a system to detect and identify a wide range of materials based on detection of the resonances associated with their quadrupolar nuclei. The NQR response signal provides a unique signature of the material of interest, where the detected electrical signal indicates the presence of quadrupolar nuclei. Exemplary uses for NQR include (but are not limited to), screening of airline baggage, parcel screening, detection of drugs/narcotics, and detection of explosives, such as detection of buried Improvised Explosives Devices (IED), and/or landmine detection.

Explosive detection systems (EDS's) may use a set of gradiometer antennas and coil transmitters that have to be tuned to required frequency, suppression of noise from faraway radio frequency (RF) sources as well as to a state where transmit/receive (Tx/Rx) cross-talk are minimized. Up to now, these antennas have been generally axially symmetric. Use of axisymmetric geometry for smaller sensors, especially for non-stationary devices such as handheld, mine-sweeper, etc., making them very unstable with respect to physical deformation.

SUMMARY

Systems that use near-field probes and related technologies, especially for detection and screening of explosives, may benefit from suppression of RF interference (RFI). Suppression of RFI is particularly relevant for NQR systems, which rely on detection of a relatively weak or small signal (NQR signals inherently can be very weak). Detection of NQR signals, using near-field probe (antenna) systems such as loop antennas, can be difficult in the presence of strong far field noise sources/signals, such as AM radio transmitters, and nearby noise sources/signals, such as automobile ignitions, computers, mobile phones, and other electronics. While the region outside of the very near vicinity of the near-field probe embodiments discussed herein is still technically part of the near-field, for at least some embodiments disclosed further herein it is outside of the most sensitive region of at least some of the antenna systems/probes described herein. Therefore these "technically" near field signals are effectively, in some embodiments described further herein, suppressed, though not as fully suppressed as are the signals that are emanating from the far-field region.

The presence of strong far field noise sources/signals presents a difficulty that arises at least in part because these kinds of noise sources can create substantial coherent and non-coherent geographically distributed noise that can be within the detection frequency ranges of interest. For example, detection of land mine explosives such as tri-nitrotoluene (TNT) can be affected by amplitude modulation (AM) radio signals sourced in the far field, because the characteristic detectable frequencies associated with TNT (used in NQR detection systems) are below 1 MHz, which is within in the standard AM radio band.

In addition, field-hardening of the sensor is a problem that needs a solution.

Previously, mechanical strengthening of out-of-plane coils was attempted. In-plane flexible elements that change coil geometry was used also. Both of these approaches suffer from the same draw-back: the cross-talk depends heavily on the minor relative variations in the coils geometry with respect to each other. The latter is very hard to control in the bumpy environments of non-stationary sensors.

According to an aspect of the disclosure, a system/device has overlapping transmit and receive antennas, which can be adjusted (moved) relative to one another, such as in a direction parallel to a plane of the antenna(s), to reduce cross talk between the antennas.

According to an aspect of the disclosure, a device includes: a transmitter antenna; and a receiver antenna that at least partially overlaps the transmitter antenna, configured to reduce cross talk. At least one of the antennas is a differential antenna. The antennas are adjustable by movement of one of the antennas relative to the other of the antennas in a direction of adjustment that is parallel to or in a plane of one or both of the antennas.

According to an aspect of the disclosure, system/device has non-axial adjustment of cross-talk between gradiometer and loop antennas.

According to another aspect of the disclosure, localized area of antenna perimeter may be used for cross-talk tuning.

According to still another aspect of the disclosure, a system/device has the ability to use adjustment mechanism for structural stiffening.

According to an aspect of the disclosure, a device includes a pair of overlapping receiver antenna and transmitter antenna, configured to reduce cross talk.

According to an embodiment of any paragraph(s) of this summary, the antennas have different shapes.

According to an embodiment of any paragraph(s) of this summary, one of the antennas is circular.

According to an embodiment of any paragraph(s) of this summary, one of the antennas is oval.

According to an embodiment of any paragraph(s) of this summary, the antennas are adjustable by movement of one relative to the other.

According to an embodiment of any paragraph(s) of this summary, a direction of adjustment is parallel or in a plane of one or both of the antennas.

According to an embodiment of any paragraph(s) of this summary, the antennas are non-axisymmetric.

According to an embodiment of any paragraph(s) of this summary, the antennas are adjusted by movement in a non-axial direction.

According to an embodiment of any paragraph(s) of this summary, the device includes an adjustment mechanism.

According to an embodiment of any paragraph(s) of this summary, the adjustment mechanism provides structural stiffening.

According to an embodiment of any paragraph(s) of this summary, the device further includes a cross-talk tuner.

According to an embodiment of any paragraph(s) of this summary, the device is a handheld device.

According to an embodiment of any paragraph(s) of this summary, the device is a table top device.

According to an embodiment of any paragraph(s) of this summary, the device is a gradiometer.

According to an embodiment of any paragraph(s) of this summary, the device is an explosive detection device.

According to an embodiment of any paragraph(s) of this summary, the device is part of an explosive detection system.

According to an embodiment of any paragraph(s) of this summary, the device includes one or more spacers to maintain spacing between the antennas.

According to an embodiment of any paragraph(s) of this summary, the device includes a lock or locking mechanism.

According to an embodiment of any paragraph(s) of this summary, the antennas are coils.

According to an embodiment of any paragraph(s) of this summary, the device is used in a method of cross-talk adjustment.

According to an embodiment of any paragraph(s) of this summary, the device is used in a method of detection.

According to another aspect of the disclosure, a method of reducing cross talk in an antenna system includes: adjusting relatively positioning of a transmit antenna and a receive antenna, with the adjusting includes relative movement of the antennas in a direction of adjustment that is parallel to or in a plane of one or both of the antennas; and monitoring energy coupling between the antennas at multiple relative positions between the antennas.

According to an embodiment of any paragraph(s) of this summary, the antennas are planar, and planes of the antenna are maintained at a fixed distance from each other.

According to an embodiment of any paragraph(s) of this summary, the antennas are locked in place relative to one another at a position of minimum energy coupling.

While a number of features are described herein with respect to embodiments of the disclosure; features described with respect to a given embodiment also may be employed in connection with other embodiments. The following description and the annexed drawings set forth certain illustrative embodiments of the disclosure. These embodiments are indicative, however, of but a few of the various ways in which the principles of the disclosure may be employed. Other objects, advantages, and novel features according to aspects of the disclosure will become apparent from the following detailed description when considered in conjunction with the drawings.

BRIEF DESCRIPTION OF THE DRAWINGS

The annexed drawings, which are not necessarily to scale, show various aspects of the disclosure in which similar reference numerals are used to indicate the same or similar parts in the various views.

DETAILED DESCRIPTION

A system/device, such as a gradiometer probe for detecting RF signals, or for example for explosive detection, has the shape of the coils in its adjustment mechanism that minimizes the cross-talk between the receiver probe (Rx) and the transmitting antenna (Tx) in such a way as to minimize (or reduce) the areas where the distance between the coils during the adjustment is the smallest. Moving coils along the plain of the coils is one mechanism of achieving it. Having the coils of different shapes, e.g., circular receiver and oval transmitter coils, is another. Many shapes are possible, including circular, oval, elliptical, and polygonal, to give a few examples. In some embodiments both of these methods/approaches are combined in a single device.

A non-axial system/device is configured such that the cross-talk adjustment is achieved by movement of Tx and Rx antennas with respect to each other in the plane parallel to the planes of the antenna coils.

One advantage of the proposed configuration is that it strongly localizes the areas of the coils which control the cross-talk and, thus, requires stabilization of very small areas of the coils. It decreases sensitivity to minor variation of coil geometry. In addition, the sensitivity to relative motion in-plane is lower than the same for out-of-plane; thus, the adjustment is more robust with respect to shake, rattle, and roll.

The in-plane adjustment makes it is easier to fix structure to make it very robust.

Non-asymmetric systems have been harder to design and model, so axisymmetric systems predominate.

Figure 1A:
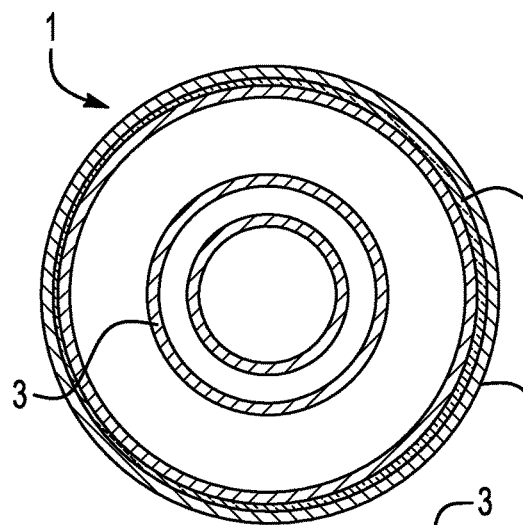
FIG. 1A shows a plan view of a conventional antenna system.
Figure 1B:
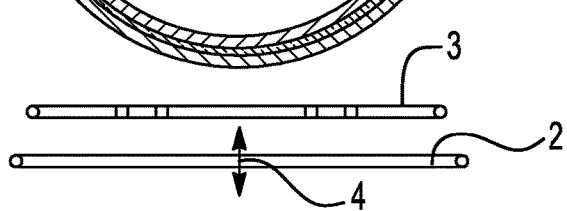
FIG. 1B shows a side view of the conventional antenna system of FIG. 1A.

Present systems tend to be axisymmetric. FIGS. 1A and 1B show an example of a conventional axisymmetric antenna system 1, in which there is a large region that is sensitive to cross-talk between antennas 2 and 3, in which the antennas 2 and 3 have position adjustment by moving them in a direction 4, toward or away from one another. It turns out cross-talk in axisymmetric system is unstable with respect to small deviations from ideal geometry, for example in the cross-talk sensitive areas 6. This realization is nottrivial, not widely understood, to the extent that it is known at all.

Figure 2A:
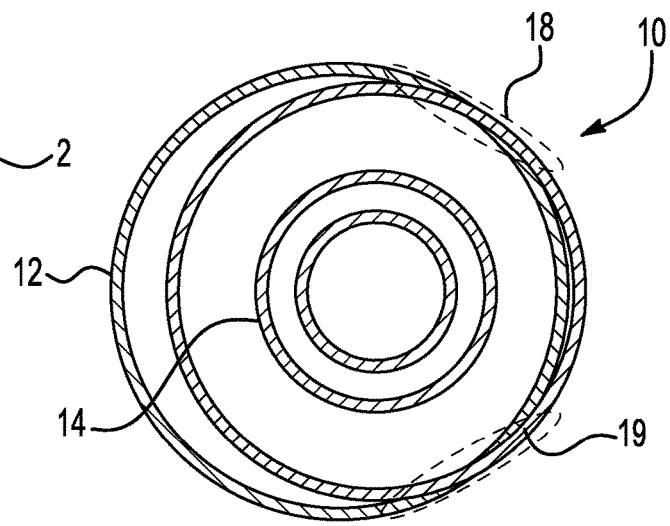
FIG. 2A shows a plan view of an antenna arrangement according to an embodiment.
Figure 2B:
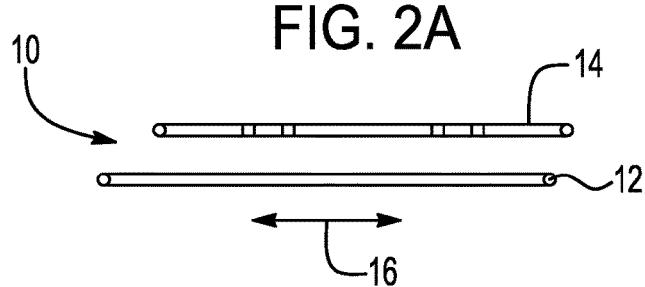
FIG. 2B shows a side view of the arrangement of FIG. 2A.

FIGS. 2A and 2B shows an embodiment of the present system/device 10, with a configuration that reduces crosstalk-sensitive areas between a transmit antenna 12 and a receive antenna 14. The adjustment motion may be in a direction 16 that is parallel to the two antennas 12 and 14. The cross-sensitive areas 18 and 19 in this arrangement are much smaller than those of the system 1 (FIG. 1), and therefore cross-talk may be easier to control.

Figure 3:
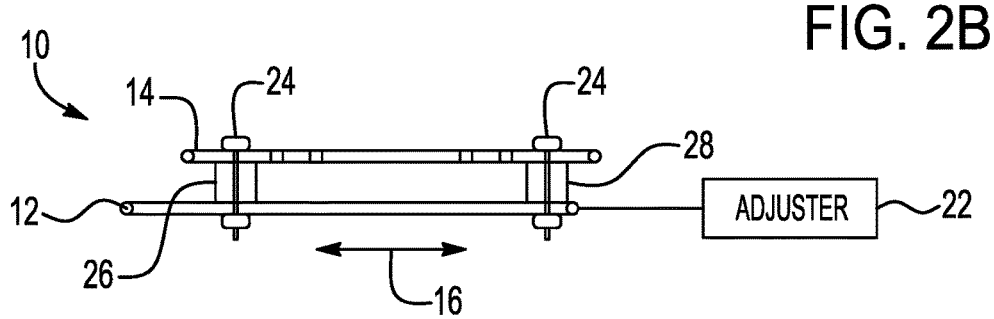
FIG. 3 shows a side view of the antenna arrangement of FIG. 2A, with additional components of the device shown.

FIG. 3 shows further details of the device/system 10, including an adjustment mechanism (or adjuster) 22 that may be used to accomplish the relative adjustment between the antennas 12 and 14, in the adjustment direction 16, a locking system (or lock) 24 that may be used as part system/device 10, and spacers 26 and 28 that may be used to hold the antennas 12 and 14 apart.

The antennas 12 and 14 may be made of a suitable electrically-conductive material, such as metal, and may be held in separate structures, which may be made of suitable non-conductive material, such as suitable plastics. The structures may be moved relative to one another using the adjustment mechanism. The adjustment mechanism (or adjuster) 22 may include any of a wide variety of electrical and/or mechanical parts for moving the antennas 12 and 14 relative to each other. Non-limiting examples of components for the adjuster 22 include gears, motors, threaded shafts, and cams, arranged so as to effect translation in the direction 16. In one example a cam coupled to a holder for one of the antennas 12 and 14 may be turned to engage a slot in a holder for the other of the antennas 12 and 14, accomplishing relative translation between the antennas 12 and 14. It will be appreciated that many other suitable translation mechanisms are known.

The locking system (or lock) 24 may be used to secure the antennas 12 and 14 (and their respective holders) in place once suitable adjustment has been made. Examples of suitable locks include clamps and set screws.

The spacers 26 and 28 may maintain the distance between the antennas 12 and 14. For planar antennas 12 and 14 the spacers 26 and 28 may maintain a constant distance between the respective planes of the antennas 12 and 14. The spacers 26 and 28 may be made of electrically-nonconductive material, such as plastic. The spacers 26 and 28 may be parts of one or both of the respective holders which are used to mount the antennas 12 and 14.

At least one of the antennas 12 and 14 may be a differential antenna (or gradient probe). For example the receive antenna may be configured to receive a much weaker signal than is transmitted by the transmit antenna, and therefore it may be advantageous for the receiver antenna to be a differential antenna. In one example, an explosives detection device, the transmit energy may be on the order of kilowatts and the received energy may be on the order of microwatts.

Figure 4:
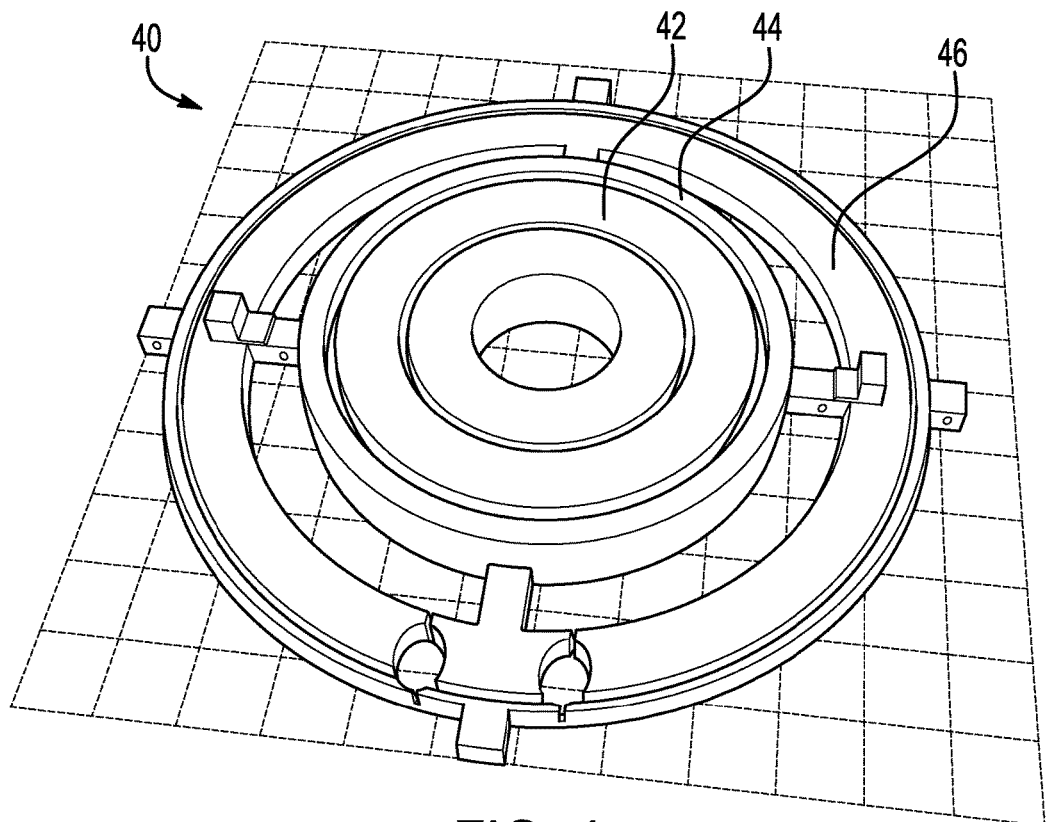
FIG. 4 shows an oblique view of a holder that may be part of the device of FIG. 3.

FIG. 4 shows a holder 40 which may be used for securing a receive antenna or antennas in grooves 42 and 44. The holder 40 may be a 3D printable structure that may be part of the systems described herein, for example made of plastic, which may engage a corresponding holder for holding a transmit antenna, which may for example overlap an outer ring 46 of the holder 40.

Figure 5:
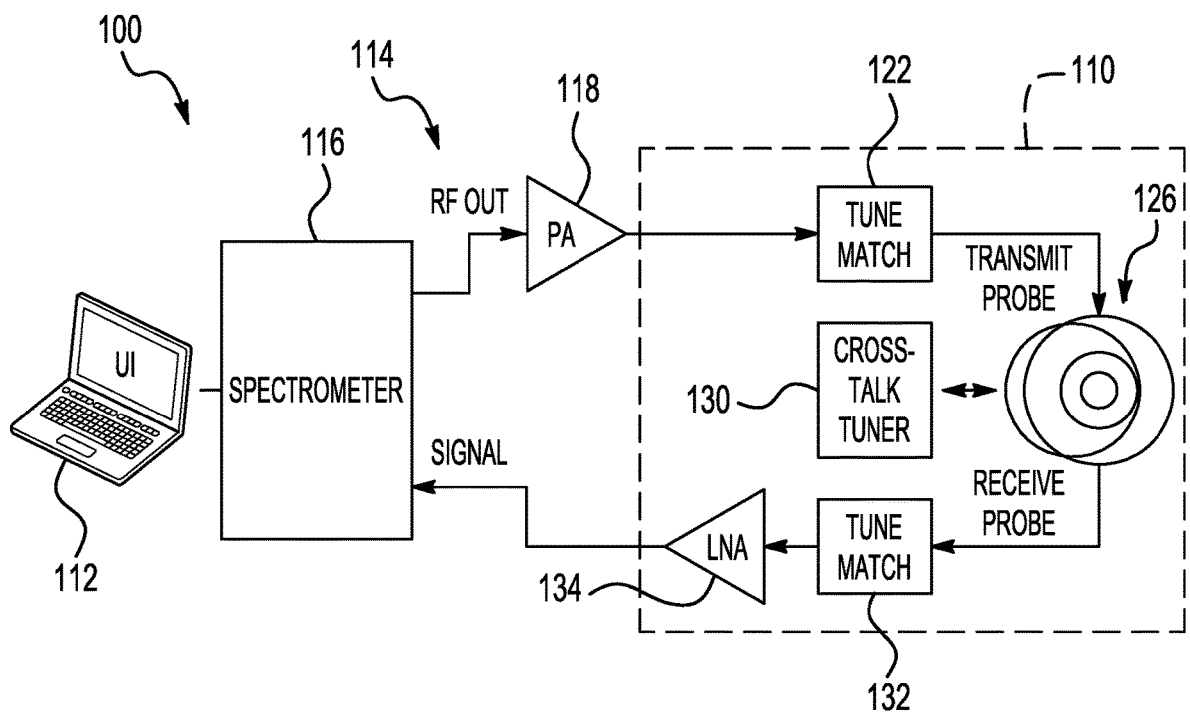
FIG. 5 is a block diagram illustrating calibration of a device, according to an embodiment.

FIG. 5 shows a functional block diagram of a system 100, for example including a handheld device 110, and its interaction with other devices. The device 110 may be similar in many respects with the device 10 (FIG. 3) described above.

The system 100 may be used to calibrate the device 10, to reduce or minimize cross talk for example.

A user interface (UI) computer 112, such as a standard laptop or other computer, is coupled to an analyzer 114 that has two functions: detection and tuning. In detection mode the analyzer 114 detects NQR signals. In tuning mode the analyzer 114 provides information that is required to adjust the geometry of the Tx and Rx antennas.

In tuning mode the analyzer performs a function similar to a vector network analyzer (VNA), in order to calibrate the device 110 to reduce cross talk. The analyzer 114 may include a spectrometer 116 and a power amplifier (PA) 118. The spectrometer 116 produces an RF signal for use in calibrating the device 110, and the PA 118 amplifies that signal.

Within the device 110, which may be a handheld device, the amplified signal passes through a tune matching block 122, to provide a transmit probe signal to a transmit antenna, one of the overlapping antennas shown at 126. The tune match 122 is a narrow band transformation device to transform the RF signal to an impedance that can be effectively used in the antennas of the device 110. A cross-talk tuner 130 may be used to adjust the relative position of the antennas, for example using the adjuster (or adjustment mechanism) 22 (FIG. 3) described above.

A receive probe signal is sent by a receive antenna, through a tuning match 132 and a low-noise amplifier (LNA) 134, back to the spectrometer 116. The output is provided to the user through the interface 112.

A goal in the calibration/adjustment is to minimize the energy coupling (cross talk) between the transmit antenna and the receive antenna. Adjustment using the tuner 130 may be performed until the cross-talk is minimized, or reduced to an acceptable level. The adjustment process may be manually performed by a user, or alternatively may be a partially- or fully-automated process. The cross-talk tuner 130 may be (or may include) circuits embodied in hardware and/or software to accomplish the adjustment of the relative position of the antennas at 126. For example, the return signal from the receive antenna may be examined at various relative positions between the antennas, for a minimum return signal indicating a position where cross talk is at a minimum. The turner 130 may operate a positioning mechanism such as motors and/or mechanical adjusters, such as gearing or screw-driven mechanical adjusters, to adjust relative position of the antennas. To give one non-limiting example, a threaded bolt or worm gear may engage with internal threads on a nut coupled to one of the antennas, such that turning the bolt or worm gear moves the nut (and thus the antenna coupled to the nut) along the bolt/gear shaft.

It may be desired to achieve at least 20 dB of isolation from cross talk. More narrowly, it may be desirable to achieve at least 40 dB of isolation.

After calibration of the device 110 as discussed above, the antennas may be locked into place relative to one another, for example using device(s) such as the lock 24 (FIG. 3) described above. The calibration may be a one-time event, or alternatively may be repeated and changed for different operating conditions, such as when a change in the frequency of operation is desired.

The devices described herein may have any of a variety of suitable uses. One is in explosive detection devices/systems (EDS's), where a signal is transmitted that produces a detectable response from nearby explosives, for example explosives in bulk in the vicinity of the detector device. Such explosive detection devices may be used to detect explosives in shipping containers, in vehicles, or at transportation sites such as airports, to give a few non-limiting examples.

The approaches described above may be used in an EDS, such as a table-top EDS or a handheld EDS. Such devices may be used to scan an entire pallet of items at once, and/or may be used to scan/inspect individual items. Such systems advantageously may be RF systems.

EDS's may be used for and/or incorporated into larger 'systems' such as Border Protection system, highway tolling/inspection, military force/base protection and for embassy security.

Many parts may be suitable for use in such EDS's. For example a suitable amplifier may be from E&I Amplifiers, and a suitable spectrometer circuit board may be made by Spincore Technologies.

Scanners could be used/sold commercially for checkpoint scanning during commercial venues such as sports arenas, conventions, hotels, casinos, malls or embassies. And entry way requiring rapid, non-intrusive bag scanning for threat and/or narcotics.

Another potential use is in radio frequency identification (RFID) systems. It is observed that RFID systems widely use far field suppression to comply with Federal Communication Commission (FCC) requirements. Near field detectors similar to such systems may use this approach with the same results.

Figure 6:
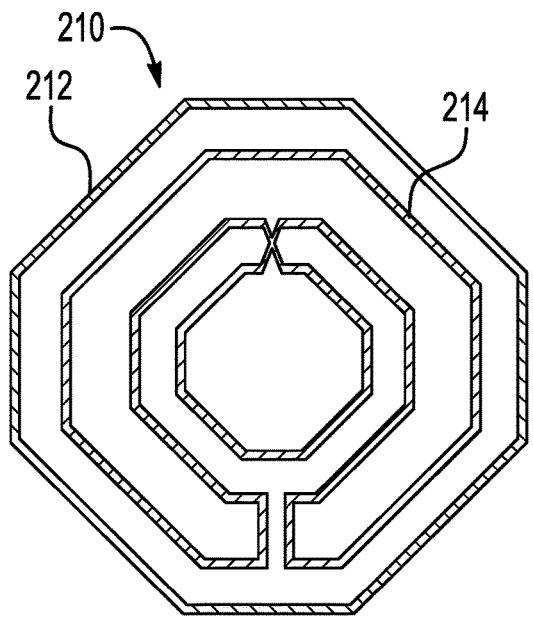
FIG. 6 is a plan view of another embodiment antenna arrangement.
Figure 7:
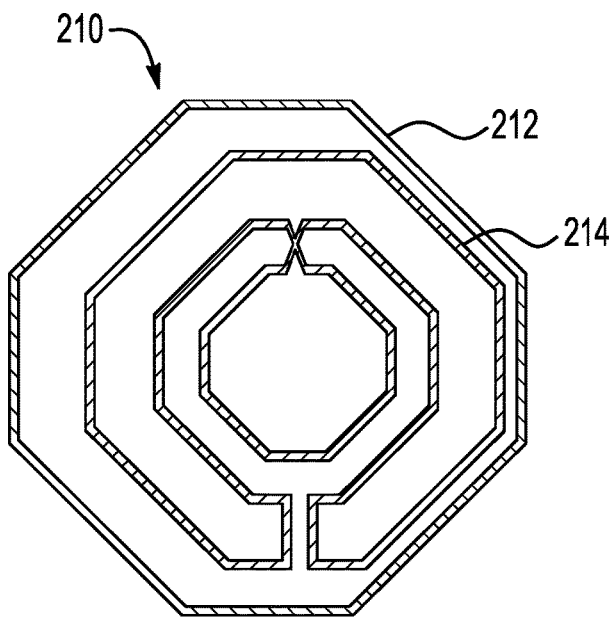
FIG. 7 is another plan view of the antenna arrangement of FIG. 6.

FIGS. 6 and 7 illustrate an alternative arrangement 210 of antennas 212 and 214, with the antennas 212 and 214 having a polygonal shape. The figures show the antennas 212 and 214 in different relative locations. In FIG. 7 the receive antenna 214 has move rightward relative to the transmit 212, compared to the positioning shown in FIG. 6.

The receive antenna 214 is a differential antenna with multiple connected together in series. This may make for a better signal strength in trying to detect a weak (low energy signal).

Figure 8:
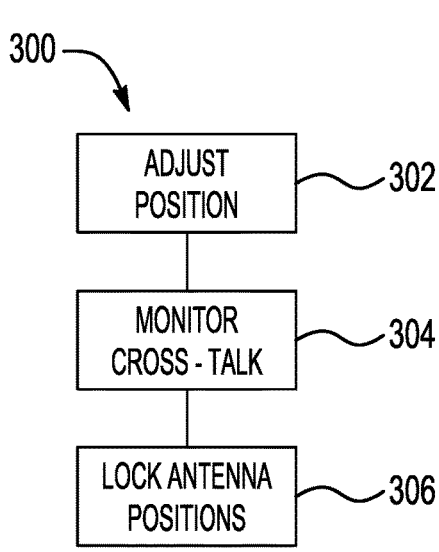
FIG. 8 is a high-level flow chart of a method, according to an embodiment.

FIG. 8 shows a high-level flow chart of a method 300 for compensating for cross talk, such as in an explosive probe. In step 302 overlapping transmit and receive antennas are adjusted in position relative to one another. In step 304 this is continued while cross-talk is monitored, searching for a position of minimum cross talk (minimum energy coupling) between the transmit and receive antennas. Finally, in step 306 the antennas are locked (or fixed or maintained) in a desired position, such as to minimize cross talk.

Although the disclosure has been shown and described with respect to a certain embodiment or embodiments, equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the disclosure. In addition, while a particular feature of the disclosure may have been described above with respect to only one or more of several illustrated embodiments, such feature may be combined with one or more other features of the other embodiments, as may be desired and advantageous for any given or particular application.

What is claimed is:

1. A device comprising:
a transmitter antenna;
a receiver antenna that at least partially overlaps the transmitter antenna;
multiple spacers configured to maintain spacing between the antennas; and
multiple locks, each lock corresponding to one of the multiple spacers, the locks configured to releasably lock the antennas in a positional relationship relative to each other;
wherein at least one of the antennas is a differential antenna; and
wherein the antennas are adjustable by movement of one of the antennas relative to the other of the antennas in a direction of adjustment that is parallel to or in a plane of one or both of the antennas.

2. The device of claim 1, wherein the antennas have different shapes.

3. The device of claim 1, wherein one of the antennas is circular.

4. The device of claim 1, wherein one of the antennas is oval.

5. The device of claim 1, wherein the antennas are non-axisymmetric.

6. The device of claim 1, further comprising an adjuster configured to adjust the positional relationship of the antennas relative to one another.

7. The device of claim 6, wherein the adjuster comprises an adjustment mechanism that provides structural stiffening.

8. The device of claim 1, further comprising a cross-talk tuner operatively coupled to at least one of the antennas.

9. The device of claim 1, wherein the differential antenna is a multi-loop antenna.

10. The device of claim 9, wherein multiple loops of the multi-loop antenna are connected in series.

11. The device of claim 1, wherein the device is a handheld device.

12. The device of claim 1, wherein the device is a table top device.

13. The device of claim 1, wherein the device is an explosive detection device.

14. A method of reducing cross talk in an antenna system, the method comprising:
adjusting a relative position of a transmitter antenna and a receiver antenna that at least partially overlaps the transmitter antenna, the adjusting comprising moving one of the antennas relative to the other of the antennas in a direction of adjustment that is parallel to or in a plane of one or both of the antennas; and
monitoring energy coupling between the antennas at multiple relative positions between the antennas;
wherein the antenna system comprises (i) multiple spacers configured to maintain spacing between the antennas and (ii) multiple locks each corresponding to one of the multiple spacers, the locks configured to releasably lock the antennas in a positional relationship relative to each other.

15. The method of claim 14, wherein the antennas are planar, and planes of the antennas are maintained at a fixed distance from each other.

16. The method of claim 14, further comprising:
locking the antennas in the positional relationship relative to one another at a position of minimum energy coupling.

17. The method of claim 14, wherein at least one of the antennas is a differential antenna.

18. The method of claim 14, wherein the antennas have different shapes.

19. The method of claim 14, wherein one of the antennas is circular.

20. The method of claim 14, wherein one of the antennas is oval.

* * * * *